US010431436B2

(12) United States Patent
Ashraf et al.

(10) Patent No.: US 10,431,436 B2
(45) Date of Patent: Oct. 1, 2019

(54) METHOD AND SYSTEM OF MONITORING AND CONTROLLING DEFORMATION OF A WAFER SUBSTRATE

(71) Applicant: SPTS TECHNOLOGIES LIMITED, Newport (GB)

(72) Inventors: Huma Ashraf, Newport (GB); Kevin Riddell, Abergavenny (GB); Roland Mumford, Cardiff (GB); Grant Baldwin, Newport (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 15/690,414

(22) Filed: Aug. 30, 2017

(65) Prior Publication Data
US 2018/0144911 A1 May 24, 2018

(30) Foreign Application Priority Data

Sep. 6, 2016 (GB) .................................. 1615114.4

(51) Int. Cl.
H01J 37/32 (2006.01)
H01L 21/67 (2006.01)

(52) U.S. Cl.
CPC .. *H01J 37/32935* (2013.01); *H01J 37/32082* (2013.01); *H01J 37/32715* (2013.01); *H01J 37/32724* (2013.01); *H01J 37/32917* (2013.01); *H01L 21/67069* (2013.01); *H01L 21/67288* (2013.01); *H01J 2237/334* (2013.01)

(58) Field of Classification Search
CPC .......... H01J 37/32917; H01J 37/32724; H01J 37/32082; H01J 37/32935; H01L 21/67288; H01L 21/67069
USPC .............................................. 216/59, 61, 71
See application file for complete search history.

(56) References Cited

U.S. PATENT DOCUMENTS

| 5,810,963 A | 9/1998 | Tomioka |
| 2007/0215282 A1 | 9/2007 | Itabashi et al. |
| 2008/0026488 A1* | 1/2008 | Panda ............... H01J 37/32935 438/9 |
| 2008/0068774 A1 | 3/2008 | Sumiya et al. |
| 2009/0056627 A1* | 3/2009 | Shuto ...................... C23C 16/52 118/712 |
| 2011/0090613 A1 | 4/2011 | Balasubramanian et al. |

(Continued)

FOREIGN PATENT DOCUMENTS

| WO | WO 99/14699 A1 | 3/1999 |
| WO | WO2008043047 A2 | 4/2008 |

*Primary Examiner* — Binh X Tran
(74) *Attorney, Agent, or Firm* — Volentine, Whitt & Francos, PLLC

(57) ABSTRACT

A method and system are for monitoring and controlling deformation of a wafer substrate during a plasma etching of the wafer substrate. The method includes disposing a wafer substrate on a platen assembly within a process chamber so that an entire upper surface of the wafer is exposed, passing a process gas into the process chamber, applying a radio frequency bias voltage to the platen assembly, generating a plasma within the process chamber, monitoring a voltage difference between the platen assembly and the process chamber, during the etch process, and attenuating or extinguishing the plasma to prevent further etching once a threshold monitored voltage is reached.

14 Claims, 7 Drawing Sheets

(56) References Cited

U.S. PATENT DOCUMENTS

| | | | | |
|---|---|---|---|---|
| 2013/0045604 A1* | 2/2013 | Maeda | .............. | H01J 37/32146 438/710 |
| 2014/0049162 A1* | 2/2014 | Thomas | ............ | H01J 37/32871 315/111.21 |
| 2014/0225503 A1* | 8/2014 | Mori | ................ | H01J 37/32183 315/111.21 |

* cited by examiner

METHOD AND SYSTEM OF MONITORING AND CONTROLLING DEFORMATION OF A WAFER SUBSTRATE

BACKGROUND

The present invention relates to a method and system of monitoring and controlling deflection of a wafer during a plasma etching process.

When processing wafer substrates for use in electronic and optoelectronic applications there is a need to ensure the wafer surfaces are very smooth and clean. Once the bulk wafer has been prepared various grinding, polishing and etching steps are required to produce smooth uniform surfaces. However, it is found that there can be a build up of stress near the surface of the wafer, largely as a consequence of the mechanical abrasion steps. A stress imbalance between a front and rear of the wafer can result in wafer bow, which in turn, can have adverse consequences for future process steps. To minimise the stress imbalance, various methods can be employed, such as wet chemical etching, chemical mechanical polishing or plasma etching, or a combination of these processes.

When using plasma etching to relieve stress or to produce a surface texture on a wafer substrate the key requirements are the uniform removal of material from the surface, without producing wafer damage, at as high a rate as possible. Inherent in this plasma etch process is a change in stress in the wafer that can result in wafer deformation. Excessive deformation can result in wafer breakage which is very undesirable, since the etch chamber must then typically be vented to remove the debris. This is turn results in costly downtime for the plasma etch tool.

In conventional plasma etching, the substrate is retained in position using mechanical or electrostatic clamps, and cooled through the use of a coolant, such as helium, for example. However, when the entire surface of the wafer needs to be etched, mechanical clamping cannot be used as the areas of the wafer where the clamp makes wafer contact, and thus covers the wafer, will receive a different etch rate to the exposed or uncovered areas of the wafer. Furthermore, when the substrate is an insulator such as sapphire or glass for example, an electrostatic clamp or chuck cannot be used.

SUMMARY

We have now devised a method and system of monitoring deformation of a wafer substrate during a plasma etching process.

According to a first aspect of the present invention there is provided a method of monitoring and controlling deformation of a wafer substrate during a plasma etching of the wafer substrate, the method comprising:
  disposing a wafer substrate on a platen assembly within a process chamber so that an entire upper surface of the wafer is exposed;
  passing process gas into the process chamber;
  applying a radio frequency bias voltage to the platen assembly;
  generating a plasma within the process chamber;
  monitoring a voltage difference between the platen assembly and the process chamber, during the plasma etch process;
  attenuating or extinguishing the plasma to prevent further etching, once a threshold monitored voltage is reached
In an embodiment, deformation of the wafer substrate, such as warping and bowing, is monitored relative to the platen assembly, and an amount of relative deformation is determined by monitoring the voltage difference between the platen assembly and the chamber, during the plasma etch process.

In an embodiment, the method comprises generating a plasma by inductively or capacitively coupling radio frequency (RF) power into the process chamber.

In an embodiment, the method comprises inductively coupling RF power into the chamber by applying an RF potential to one or more antenna or coils disposed around the chamber. Alternatively, or in addition thereto, the method comprises capacitively coupling an RF potential to the platen assembly to produce a plasma in the chamber.

The method comprises monitoring a peak-to-peak voltage difference (Vpp) between the platen assembly and the chamber. In a further embodiment, the method comprises or further comprises monitoring a direct current voltage difference (Vdc) between the platen assembly and the chamber.

In an embodiment in which the wafer comprises an initially flat configuration, the method comprises attenuating or extinguishing the plasma, once the peak-to-peak voltage difference between the platen assembly and the chamber exceeds 10%, and preferably 20%, of a peak-to-peak voltage difference at the start of the etching process. Alternatively, or in addition thereto, the method may comprise attenuating or extinguishing the plasma once the direct current voltage difference between the platen assembly and the chamber exceeds 50%, and more preferably 100%, of a direct current voltage difference at the start of the etching process. In either situation, the method is arranged to prevent further etching in order to prevent excessive warping and bowing of the wafer during the etch process, which can lead to a breaking or fracture of the wafer substrate.

In an embodiment in which the wafer comprises an initially deformed or warped configuration, the method comprises attenuating or extinguishing the plasma once the monitored peak-to-peak voltage difference or direct current voltage difference reduces to a value which is characteristic of a peak-to-peak voltage difference or direct current voltage difference respectively, of a wafer which extends in a substantially flat orientation upon the platen assembly. This method step is arranged to prevent further etching of an initially warped wafer, where the initial warping is primarily caused by the presence of an undesirable layer on the wafer. As the layer is removed during the etch process then the wafer will relax to a preferred flattened state upon the platen assembly. The method thus provides an indication of the configuration of the wafer so that the etching process can be terminated at the appropriate time.

In an embodiment, the method further comprises controlling a temperature of the platen assembly, to aid regulating the temperature of the wafer substrate.

In an embodiment, the method further comprises applying a radio frequency (RF) potential to the platen assembly, to provide a bias voltage on the platen assembly.

According to a second aspect of the present invention there is provided a system for monitoring deformation of a wafer substrate during a plasma etching of an entire upper surface of the wafer substrate, the system comprising:
  a process chamber;
  a platen assembly disposed therein configured to receive a wafer substrate,
  an inlet for receiving process gas into the chamber;
  means for generating a plasma;
  a voltage generator which is configured to apply a radio frequency voltage to the platen assembly, to bias the voltage of the platen assembly;

a monitoring arrangement configured to monitor a voltage difference between the platen assembly and the process chamber, during the plasma etch process; and a processor communicatively coupled with the monitoring arrangement and the means for generating a plasma, which is configured to attenuate or extinguish the plasma to prevent further etching, once a threshold monitored voltage is reached.

In an embodiment, the monitoring arrangement is configured to output a signal, representative of the voltage difference between the platen assembly and the chamber, to the processor. The processor is configured to determine an amount of deformation relative to the platen assembly in dependence of the signal output from the monitoring arrangement, and output a signal to the means for generating a plasma in dependence of the signal output from the monitoring arrangement.

In an embodiment, the means for generating a plasma comprises an RF generator which is arranged to inductively or capacitively couple RF power into the chamber. The processor is communicatively coupled with the RF generator, for controlling the coupling of RF power into the chamber.

The means for generating a plasma further comprises one or more antenna or coils disposed around the chamber which are electrically coupled with the RF generator for generating a plasma in the chamber. Alternatively, or in addition thereto, the RF generator may be electrically coupled to the platen assembly for generating plasma in the chamber.

The monitoring arrangement is preferably configured to monitor a peak-to-peak voltage difference between the platen assembly and the chamber. In a further embodiment, the monitoring arrangement is configured to monitor or further monitor a direct current (dc) voltage difference between the platen assembly and the process chamber.

The system further comprises means for controlling a temperature of the platen assembly.

According to a third aspect of the present invention, there is provided a system for monitoring deformation of a wafer substrate during a plasma etching of an entire upper surface of the wafer substrate, the system being configured to implement the method according to the first aspect.

Whilst the invention has been described above, it extends to any inventive combination of features set out above or in the following description. Although illustrative embodiments of the invention are described in detail herein with reference to the accompanying drawings, it is to be understood that the invention is not limited to these precise embodiments.

Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

BRIEF DESCRIPTION OF THE DRAWINGS

The invention may be performed in various ways, and, by way of example only, embodiments thereof will now be described with reference to the accompanying drawings, in which.

DETAILED DESCRIPTION OF EMBODIMENTS

Figure 1:
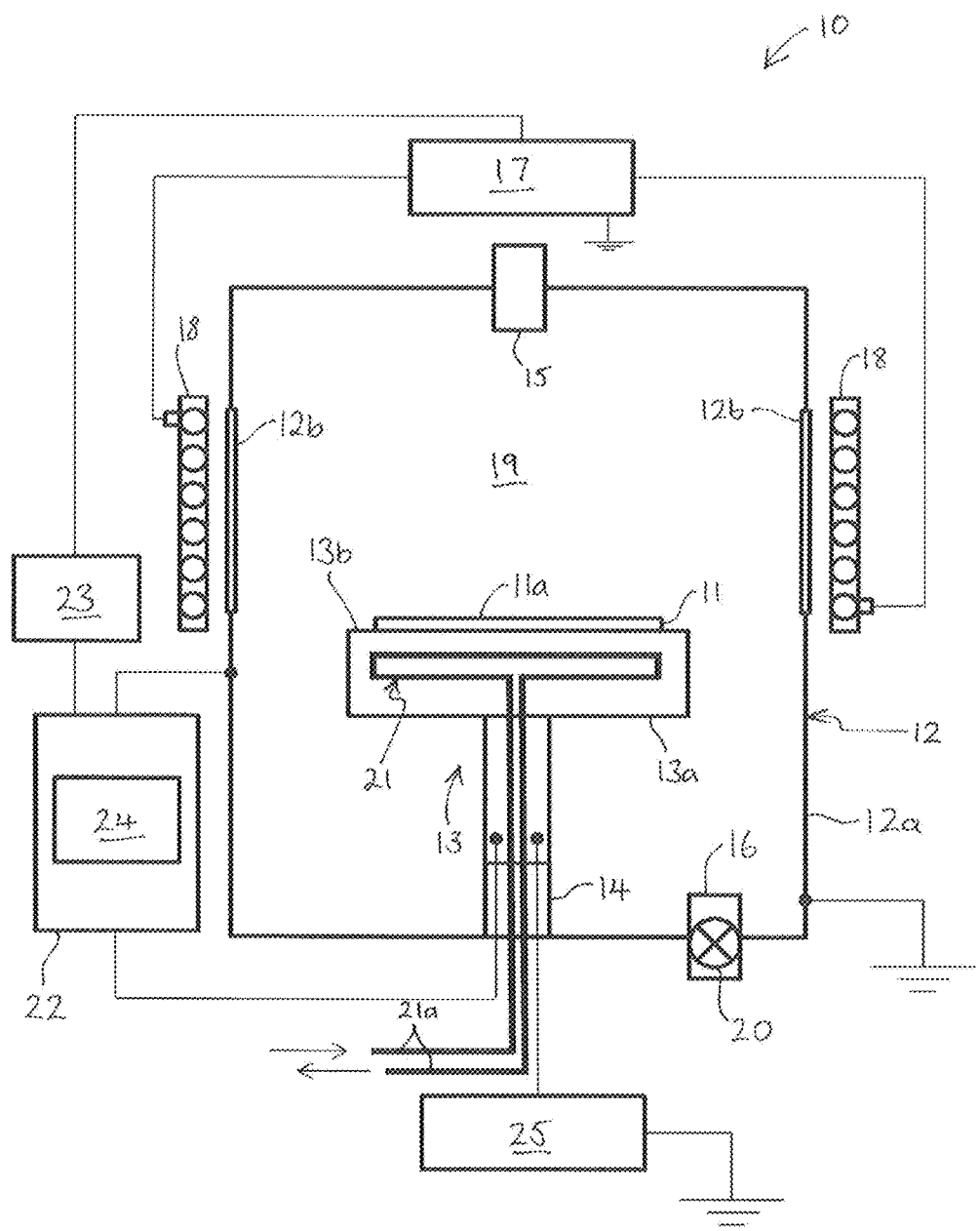
FIG. 1 is a schematic illustration of a system according to an embodiment of the present invention for monitoring deformation of a wafer substrate during a plasma etching of the wafer substrate.

Referring to FIG. 1 of the drawings, there is illustrated a system 10 according to an embodiment of the present invention for monitoring deformation of a wafer substrate 11 (hereafter referred to as "wafer"), principally an electrically insulating wafer 11, such as a sapphire or glass wafer, during a plasma etching of the wafer 11. The system 10 is arranged to monitor for any warping and bowing of the wafer 11 during the etching process, in an endeavor to preempt any fracture or cracking of the wafer 11 or otherwise terminate the etching process once the desired wafer configuration has been achieved.

The system 10 comprises a process chamber 12, within which the plasma etching of the wafer 11 is performed. The process chamber 12 comprises chamber walls 12a which may be formed of a metal, such as aluminium for example, and which are typically electrically grounded. The system 10 further comprises a platen assembly 13, which may also be formed of a metal, such as aluminium, disposed within the chamber 12, but is electrically isolated from the chamber walls 12a by conventional means, such as ceramic breaks 14.

The platen assembly 13 comprises a body 13a having a support surface 13b for receiving the wafer 11. The wafer 11 is not mechanically clamped to the platen assembly 13 and this ensures that there are no regions of the wafer 11 which are covered by the clamp (not shown). In turn, this ensures that the entire upper surface 11a of the wafer 11 is exposed and subjectable to a substantially similar rate of etching, which assists in minimizing stress variations across the wafer surface. The wafer 11 is thus simply placed on the support surface 13b prior to initiating an etch process.

The system 10 and in particular the chamber 12, further comprises a gas inlet 15 to which a source of process gas (not shown) can fluidly couple for introducing the gas, which may comprise argon, chlorine or boron trichloride gas for example, into the chamber 12. The chamber 12 further comprises an outlet 16, via which the process gas and any by-products of the etching process can pass out from the chamber 12.

In an embodiment, the plasma is generated by applying a radio frequency (RF) voltage from an RF voltage generator 17, to one or more antenna 18, which are disposed around the chamber 12 and located adjacent a respective dielectric window section 12b formed in the chamber walls 12a. The one or more antenna 18 may comprise a substantially planar spiral configuration, a helical coil configuration or a toroidal configuration, for example, and as with standard practice, impedance matching of the RF signal from the generator 17 with the antenna 18 is carried out to minimise reflection of electrical power from the antenna 18. The antennas 18 are placed around the chamber 12 and the electrical power is inductively coupled into the chamber 12, through the dielectric window sections 12b.

A plasma is generated in a region 19 of the chamber 12 which is disposed above the wafer 11 so that the wafer 11 becomes exposed to the plasma. The gas is drawn through the chamber 12 via a pump, such as a turbo molecular pump 20, which may be disposed in the outlet 16 of the chamber 12 or downstream thereof, and the inlet 15 and outlet 16 of the chamber 12 are disposed on opposite sides of the plasma region 19 so that the process gas is required to pass through the chamber 12, via the region 19 and over the wafer 11, in passing to the outlet 16.

In an embodiment, the platen assembly 13 may further comprise a heat management device 21 comprising a ducting arrangement 21a which extends through the platen assembly 13 for communicating a fluid therethrough. The fluid (not shown) is arranged to exchange heat with the platen assembly 13 and regulate the temperature of the platen assembly 13, and thus control the temperature of the wafer 11.

The system 10 further comprises a monitoring arrangement 22 which is arranged to monitor a voltage difference between the platen assembly 13 and the chamber walls 12a, and a processor 23 for controlling the RF power coupled into the chamber 12. The monitoring arrangement 22 may comprise a voltage sensing device 24, such as a voltmeter, which is configured to monitor a peak-to-peak voltage difference between the platen assembly 13 and the chamber walls 12a, and also a direct current (dc) voltage difference between the platen assembly 13 and the chamber walls 12a. The voltage sensing device 24 is communicatively coupled to the processor 23 and is arranged to output a signal representative of the peak-to-peak voltage difference and the dc voltage difference to the processor 23.

The system may further comprise a voltage generator 25, for applying a radio frequency bias voltage, to the platen assembly 13. The provision of a negative bias voltage to the platen assembly 13 for example, can help to control positively charged ion bombardment of the surface of the wafer 11.

Figure 2:
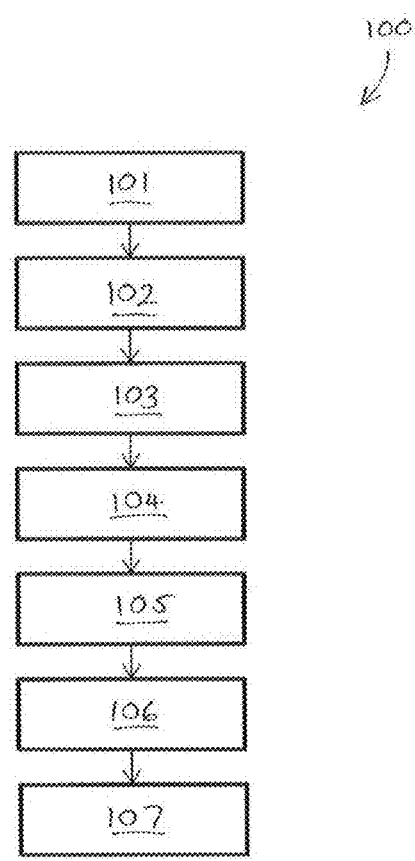
FIG. 2 is a schematic illustration of the steps associated with a method according to a first embodiment of the present invention for monitoring deformation of a wafer substrate during a plasma etching of the wafer substrate.

Referring to FIG. 2 of the drawings, there is illustrated the steps associated with a method 100 according to a first embodiment of the present invention for monitoring and controlling deformation of a wafer substrate 11, principally an electrically insulating wafer 11, during a plasma etching of the wafer 11. The wafer 11 is first placed upon the platen assembly 13 within the chamber 12 at step 101, and the chamber 12 is subsequently evacuated prior to passing a process gas through the chamber 12, at step 102. The process gas is drawn into the chamber 12 from a source thereof (not shown) by the pump 20, and the pressure within the chamber 12 is maintained at approximately 5-25 mT by a pressure controller (not shown). The gas is drawn from the inlet 15, through the plasma region 19 and over the wafer 11, prior to exiting the chamber 12 via the outlet 16.

Once the chamber 12 has been suitably evacuated and/or purged with the process gas, an RF potential, typically operating between 2 MHz and 13.56 MHz, is applied to the antenna 18 at step 103a to inductively couple electrical power into the low pressure process gas, and thus initiate a plasma and commence the etching of the wafer substrate 11. A bias voltage is also applied to the platen assembly 13 through the use of the voltage generator 25, typically operating between 380 kHz and 13.56 MHz, at step 103b.

The Vpp and Vdc values are found to be dependent on the area of the support surface 13b which is exposed to the plasma, namely the area of the support surface 13b which is not in contact with the wafer 11. Any deformation or reconfiguration of the wafer 11 resulting from the etching process, such as any warping, bowing or even flattening of the wafer 11 particularly along a periphery of the wafer 11, will result in a change in the area of the support surface 13b which is covered by the wafer 11. This manifests as a change in the area of the support surface 13b which is exposed to the plasma and thus a change in Vpp and Vdc.

Vpp and Vdc are monitored by the monitoring arrangement 22 at step 104. In an embodiment where the method is used to prevent wafer fracture or breakage, a signal representative of the monitored values for Vpp and Vdc components at the start of the etch process is recorded and used to preset a threshold value for the Vpp and Vdc voltage components, at step 105, for triggering an attenuation of the plasma or for causing the plasma to become extinguished. The threshold value for the Vpp component is typically set at 10-20% above the initial Vpp value, whereas the threshold value of the Vdc component may be set at typically 50-100% above the initial Vdc component.

The signal representative of the monitored values for Vpp and Vdc components is periodically communicated to the processor 23 during the etching process at step 106, and in the event that the signal indicates that the Vpp or Vdc voltage component rises above the respective threshold value, then the processor 23 is configured to communicate a signal to the RF voltage signal generator 17 to attenuate or extinguish the plasma at step 107, and thus prevent further etching.

Referring to FIG. 3 of the drawings, there is illustrated a representative variation of the magnitude of the Vpp voltage component and the magnitude of the Vdc voltage component in the platen assembly 13, for two 150 mm sapphire wafers as a function of the etch processing time (seconds). Table 1 below summarises the process conditions for etching a sapphire substrate at a rate of >150 nm/min using a SPTS Technologies Advanced Plamsa System (APS) plasma etch module.

Figure 3A:
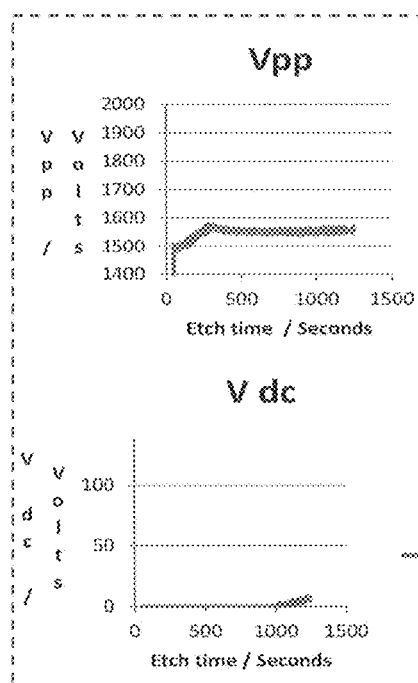
FIGS. 3(a) and 3(b) are a graphical representation of the variation in the magnitude of the induced ac and dc voltage components in the platen assembly, during the plasma etching of a wafer substrate which experiences (a) minimal deformation and (b) noticeable deformation.
Figure 3B:
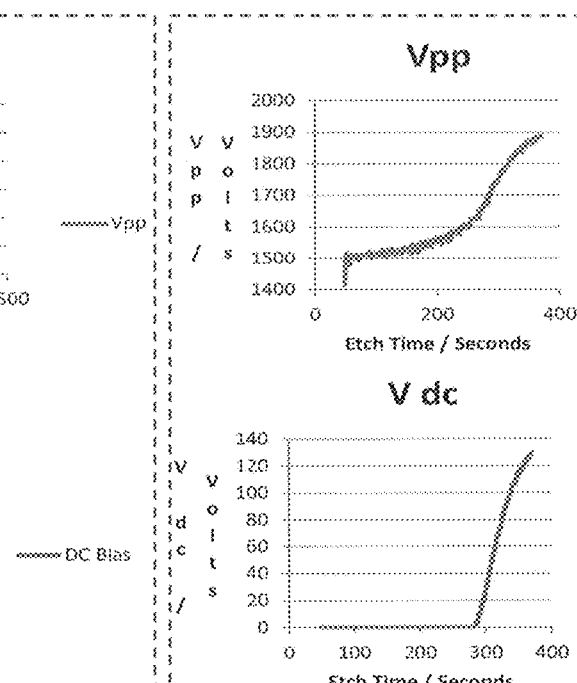

In FIG. 3a of the drawings we can see Vpp and Vdc values as a function of etch time for normal operation. Vpp is seen to be stable at approximately 1550V, and Vdc is seen to be stable at <10V during the etching process. However, in FIG. 3b of the drawings where undesirable wafer deformation occurs, Vpp is seen to increase to >1850V and Vdc is seen to increase to >100V. This increase in voltage difference between the platen assembly 13 and the chamber walls 12a, for both Vpp and Vdc is indicative of wafer deformation, since as the wafer 11 bows and warps, further regions of the support surface 13b become exposed to the plasma. Accordingly, it is anticipated that further etching of the wafer 11, will likely result in the wafer breaking due to the excessive deformation. However, as there is some degree of variation in the grinding/polishing processes of the wafer 11, there is variability in the amount of deformation, namely bow and warpage that the wafer 11 can tolerate before breaking.

TABLE 1

| Process Chemistry | Pressure | RF Source | RF Bias | Temperature |
|---|---|---|---|---|
| Ar/Cl$_2$/BCl$_3$ (160 sccm total flow) | 5-25 mT | 800-1000 W | 300-500 W | 20° C. |

Referring to FIG. 4 of the drawings there is illustrated a graphical representation of the variation in the magnitude of Vpp in the platen assembly 13 for seven sapphire wafers, each comprising a diameter of 150 mm. The wafers were separately etched using the above described system with the intention of removing approximately 1-2 μm during a front side (FS) etch and approximately 3 μm from a back side (BS) etch. A threshold value of 1770V for Vpp was set during the etching of wafers 2-7, and as such the etching process was terminated once Vpp reached this threshold value. However, no threshold value for Vpp was set for wafer 1, so that the etch process would continue regardless of the Vpp value. Table 2 below, summarises the results of the etching process for each wafer.

Figure 4A:
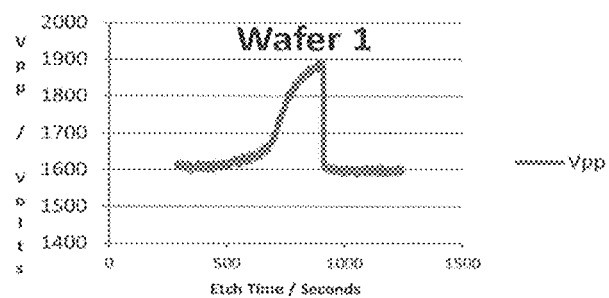
FIGS. 4(a) through 4(g) are graphical representations of the variation in the magnitude of the induced ac voltage component in the platen assembly, during the plasma etching of seven wafer substrates; and, FIG. 5 is a schematic illustration of the steps associated with a method according to a second embodiment of the present invention for monitoring deformation of a wafer substrate during a plasma etching of the wafer substrate.

Upon referring to FIG. 4 of the drawings, and initially FIG. 4a which relates to wafer 1, it is evident that Vpp increased from approximately 1600V at the start of the etching process to approximately 1884V at a process time of approximately 870 s. This increase is representative of the warp and bow of the wafer and is consistent with the theory that the wafer forms a concave structure during the etch process, and this deformation exposes more of the support surface 13b to the plasma. However, the etching process was not terminated at 870 s owing to the non-use of a threshold value for Vpp, and as such Vpp is seen to drop suddenly from 1884V to the Vpp value at the start of the etching process, namely 1600V. This discontinuous change in Vpp is characteristic of the wafer breaking, since as the wafer breaks it relaxes from the deformed, concave arrangement to the initial flat configuration in which the wafer 11 which covers the support surface 13b.

The method 200 of the second is arranged to terminate an etch process involving an initially warped or bowed wafer 11, for example. A wafer 11 may comprise a warped or bowed initial configuration due to the presence of an undesirable coating or layer of material (not shown) disposed thereon which creates a stress variation between a front and rear surface of the wafer 11. In this situation, as the etching process evolves the coating or layer will become removed which will result in the wafer 11 relaxing to a flattened state in which it covers the support surface 13b of the platen assembly 13.

The method 200 of the second embodiment is substantially the same as the method of the first embodiment and so like steps have been referenced with the same numeral, but increased by 100. In this embodiment, Vpp and Vdc are monitored by the monitoring arrangement 22 at step 204 so that the etching process can be terminated once the desired reconfiguration or deformation (namely a flat configuration) of the wafer 11 has been achieved.

A signal representative of the Vpp and Vdc components of a flat wafer disposed upon the support surface 13b is used to preset a threshold value for the Vpp and Vdc voltage components at step 205, for triggering an attenuation of the plasma or for causing the plasma to become extinguished. The signal representative of the monitored values for Vpp and Vdc components is periodically communicated to the processor 23 during the etching process at step 206, and once the signal indicates that the Vpp or Vdc voltage component has reduced to the respective threshold value (which is representative of a flat wafer), then the processor 23 is configured to communicate a signal to the RF voltage

TABLE 2

| Wafer | Pre bow (μm) | Pre warp (μm) | Post Bow (μm) | Post warp (μm) | FS etch (μm) | BS etch (μm) | Intervention |
|---|---|---|---|---|---|---|---|
| 1 | −5 | 25 | Not measured | Not measured | Not measured | Not measured | Wafer cracked |
| 2 | N/M | N/M | 79.2 | 93 | 1.12 | 2.79 | Intervention |
| 3 | −1.458 | 10.013 | 42.6 | 89.2 | 1.12 | 3.20 | Full etch |
| 4 | −2.579 | 11.486 | 55.7 | 61.0 | 1.12 | 2.73 | Intervention |
| 5 | −76.804 | 86.94 | 57.3 | 66.2 | 1.12 | 2.20 | intervention |
| 6 | −8.903 | 11.759 | 41.5 | 45 | 1.12 | 3.20 | Full etch |
| 7 | −63.06 | 93.627 | 22.7 | 31 | 2.08 | 3.20 | Full etch |

Figure 4B:
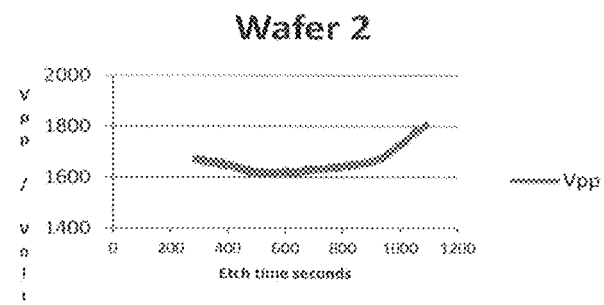
Figure 4C:
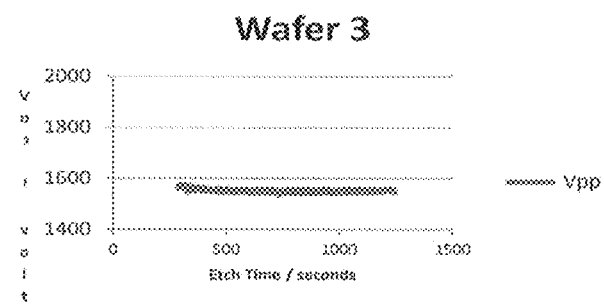
Figure 4D:
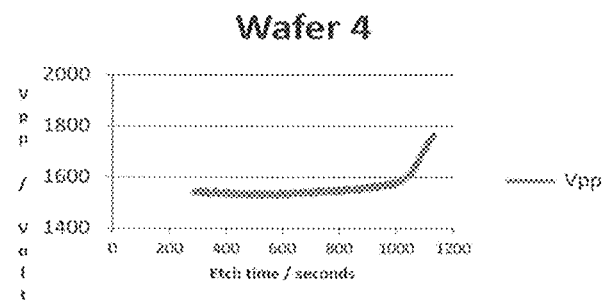
Figure 4E:
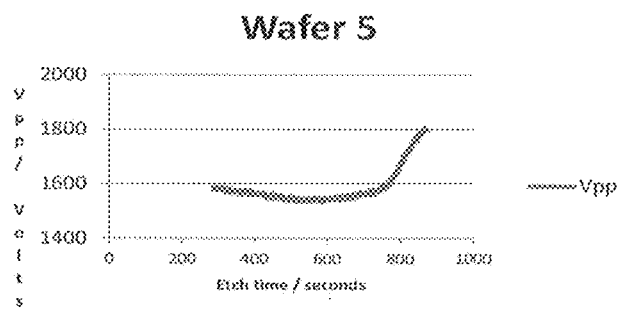
Figure 4F:
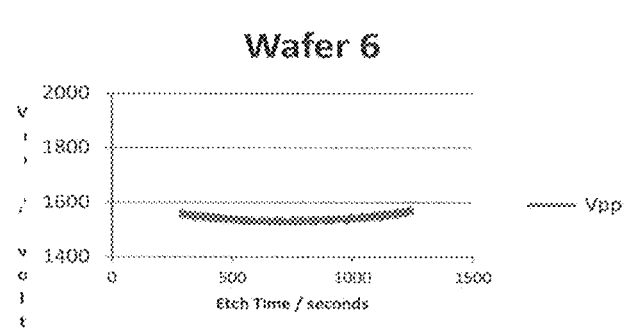
Figure 4G:
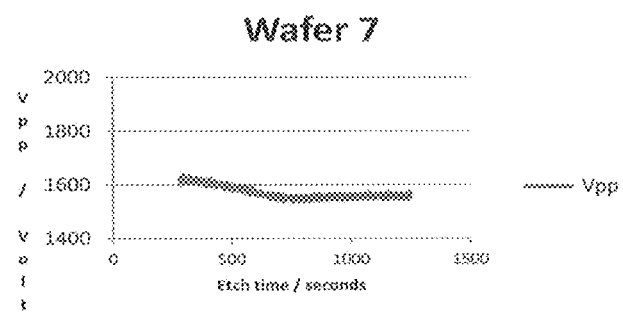

Upon referring to FIGS. 4c and 4d of the drawings and table 2, wafers 3 & 4 show similar pre-etch bow and warp values, however, it is evident that wafers 3 and 4 display different Vpp traces as a function of time (probably due to different stress distribution between the front side and back side of the wafers causing different deformations to emerge on the two wafers). Due to the rapid increase in Vpp for wafer 4 to 1770V at 1134 s, the process was stopped before completing the 3 μm back side etch to reduce the likelihood of wafer breakage. Wafers 2 and 5 also required the process to be curtailed due to Vpp values rising beyond the preset threshold value for Vpp, as illustrated in FIGS. 4b and 4e of the drawings, respectively. However, upon referring to FIGS. 4c, 4f and 4g of the drawings, it is evident that the Vpp value for wafers 3, 6 and 7 respectively, did not rise above the preset threshold and as such, there was no requirement to terminate the etch process.

Figure 5:
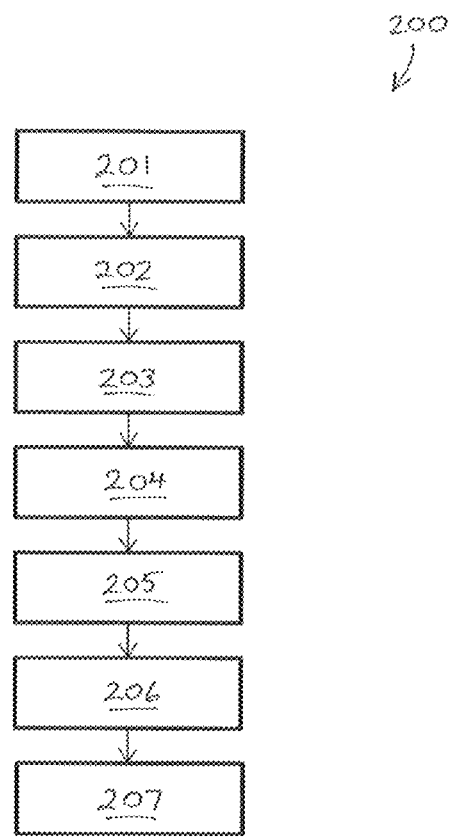

Referring to FIG. 5 of the drawings, there is illustrated a method 200 according to a second embodiment of the present invention for monitoring and controlling deformation of a wafer substrate 11, principally an electrically insulating wafer 11, during a plasma etching of the wafer 11.

signal generator 17 to attenuate or extinguish the plasma at step 107, and thus prevent further etching.

From the foregoing therefore, it is evident that the above described method and system provide for an indication of the deformation or reconfiguration of a wafer during a plasma etching process.

What is claimed is:

1. A method of monitoring and controlling deformation of an electrically insulating wafer substrate during plasma etching of the wafer substrate, the method comprising:
   disposing an electrically insulating wafer substrate on a platen assembly within a process chamber so that an entire upper surface of the electrically insulating wafer substrate is exposed;
   passing a process gas into the process chamber;
   applying a radio frequency bias voltage to the platen assembly;
   etching the exposed entire upper surface of the electrically insulating wafer substrate by generating a plasma within the process chamber;
   determining, during said etching, a warping of the electrically insulating wafer substrate relative to the platen assembly by monitoring a voltage difference between the platen assembly and the process chamber;

attenuating or extinguishing the plasma to prevent further etching once a threshold monitored voltage is reached.

2. A method according to claim 1, further comprising controlling a temperature of the platen assembly, to regulate a temperature of the wafer substrate.

3. A method according to claim 1, wherein the insulating wafer substrate is a sapphire substrate.

4. A method according to claim 1, wherein the insulating wafer substrate is a glass substrate.

5. A method according to claim 1, wherein the plasma is generated by inductively or capacitively coupling radio frequency (RF) power into the process chamber.

6. A method according to claim 5, further comprising inductively coupling RF power into the process chamber by applying an RF potential to one or more antenna disposed around the process chamber.

7. A method according to claim 1, comprising a monitoring a peak-to-peak voltage difference (Vpp) between the platen assembly and the process chamber.

8. A method according to claim 7, further comprising attenuating or extinguishing the plasma, once the Vpp between the platen assembly and the process chamber exceeds 10% of Vpp at the start of said etching.

9. A method according to claim 7, further comprising attenuating or extinguishing the plasma, once the Vpp between the platen assembly and the process chamber exceeds 20% of the Vpp at the start of said etching.

10. A method according to claim 7, further comprising attenuating or extinguishing the plasma once the Vpp reduces to a predetermined value which is characteristic of a Vpp of a representative insulating wafer substrate which extends in a substantially flat orientation upon the platen assembly.

11. A method according to claim 1, comprising or further comprising monitoring a direct current voltage difference (Vdc) between the platen assembly and the process chamber.

12. A method according to claim 11, further comprising attenuating or extinguishing the plasma, once the Vdc between the platen assembly and the process chamber exceeds 50% of the Vdc at the start of said etching.

13. A method according to claim 11, further comprising attenuating or extinguishing the plasma, once the Vdc between the platen assembly and the process chamber exceeds 100% of the Vdc at the start of said etching process.

14. A method according to claim 11, further comprising attenuating or extinguishing the plasma once the Vdc reduces to a predetermined value which is characteristic of a Vdc of a representative insulating wafer substrate which extends in a substantially flat orientation upon the platen assembly.

* * * * *